US012672500B2

(12) United States Patent (10) Patent No.: US 12,672,500 B2
Jeong (45) Date of Patent: Jun. 30, 2026

(54) SEMICONDUCTOR FABRICATION APPARATUS

(71) Applicant: SK hynix Inc., Gyeonggi-do (KR)

(72) Inventor: Doo Hyun Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 1009 days.

(21) Appl. No.: 17/873,843

(22) Filed: Jul. 26, 2022

(65) Prior Publication Data

US 2023/0178386 A1 Jun. 8, 2023

(30) Foreign Application Priority Data

Dec. 3, 2021 (KR) ........................ 10-2021-0172362

(51) Int. Cl.
 *H10P 72/00* (2026.01)
 *F25B 41/40* (2021.01)
(52) U.S. Cl.
 CPC .......... *H10P 72/0402* (2026.01); *F25B 41/40* (2021.01); *H10P 72/0434* (2026.01)
(58) Field of Classification Search
 CPC ......... H01L 21/67017; H01L 21/67098; H01L 21/67109; H10P 7/0402; H10P 7/0434; F25B 41/40
 See application file for complete search history.

(56) References Cited

U.S. PATENT DOCUMENTS 6,349,546 B1 * 2/2002 Yoo ........................... F28F 1/14
 62/50.2
2008/0289811 A1 * 11/2008 Kariya ............... G05D 23/1393
 165/300

2008/0314564 A1 * 12/2008 Nagaseki ............... G05D 23/19
 165/104.31
2014/0262199 A1 * 9/2014 Kobayashi ........ H01L 21/67248
 165/61
2016/0109508 A1 * 4/2016 Akaike .............. G01R 31/2874
 324/750.03
2016/0284521 A1 * 9/2016 Miyagawa ........ H01J 37/32449
2020/0132344 A1 * 4/2020 Seki ...................... F25B 25/005

FOREIGN PATENT DOCUMENTS

| KR | 10-2013-0031237 A | 3/2013 |
| KR | 10-2014-0089536 A | 7/2014 |
| KR | 10-2018-0012592 A | 2/2018 |
| KR | 10-1831038 B1 | 4/2018 |
| KR | 10-1892378 B1 | 8/2018 |
| KR | 10-2168153 81 | 10/2020 |

OTHER PUBLICATIONS

Office Action for Korean Patent Application No. 10-2021-0172362 issued by the Korean Intellectual Property Office (KIPO) on Oct. 21, 2025.

* cited by examiner

*Primary Examiner* — Eric S Ruppert
*Assistant Examiner* — Hans R Weiland
(74) *Attorney, Agent, or Firm* — IP & T GROUP LLP

(57) ABSTRACT

A semiconductor fabrication apparatus may include a plurality of refrigerant suppliers, a plurality of mixers, a plurality of chambers and a common reservoir. The mixers may commonly receive a refrigerant from the refrigerant suppliers. The chambers may be connected to one of the mixers. The common reservoir may supply the refrigerant to the refrigerant suppliers. The common reservoir may collect the refrigerant from the chambers.

17 Claims, 10 Drawing Sheets

Figure 2:
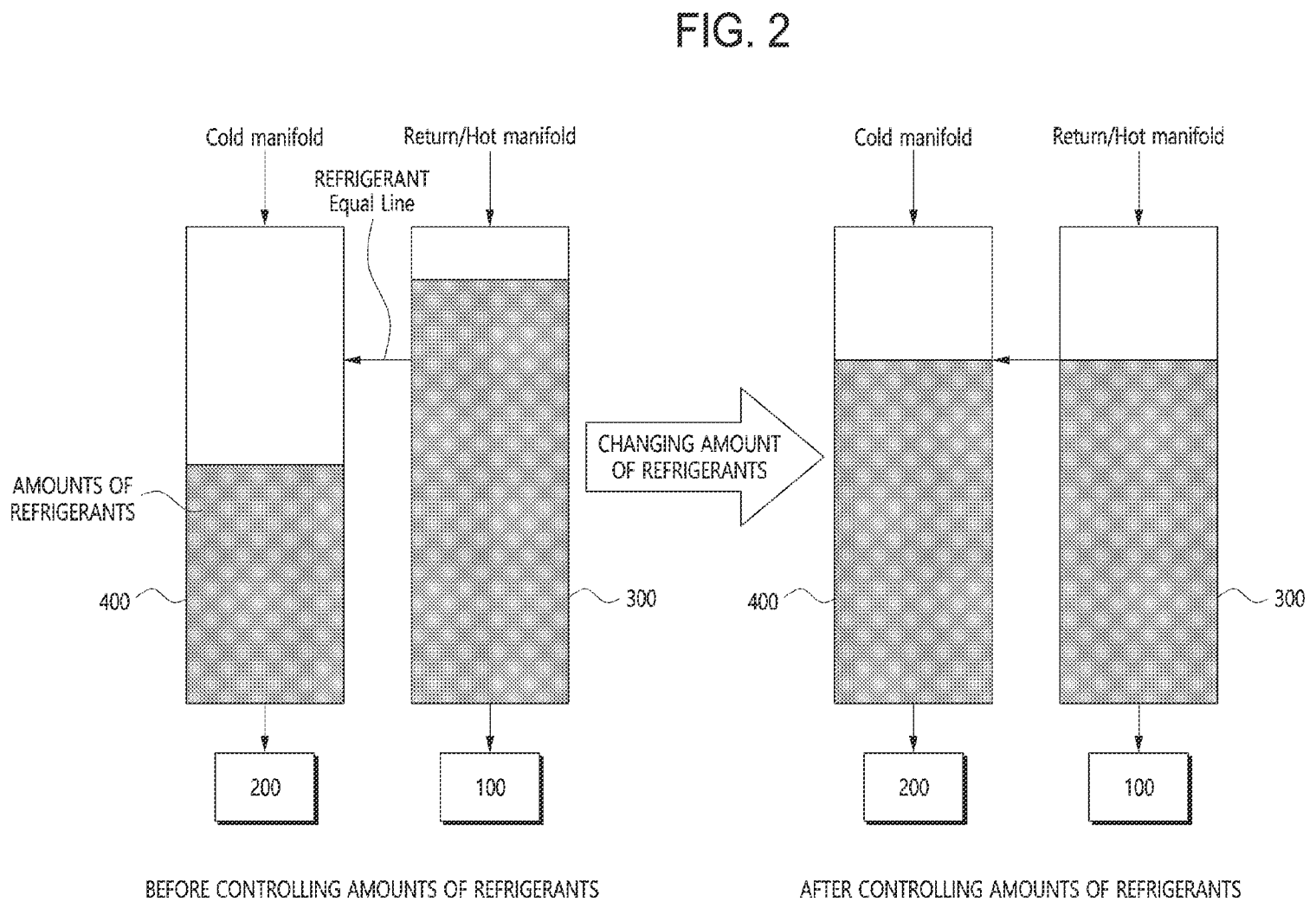

BEFORE CONTROLLING AMOUNTS OF REFRIGERANTS

AFTER CONTROLLING AMOUNTS OF REFRIGERANTS

CHANGING AMOUNT OF REFRIGERANTS

FIG. 3

BEFORE

AFTER

CONTROLLING FORWARD DIRECTION OF REFRIGERANT

CONTROLLING REVERSE DIRECTION OF REFRIGERANT

SEMICONDUCTOR FABRICATION APPARATUS

CROSS-REFERENCES TO RELATED APPLICATION

The present application claims priority under 35 U.S.C. § 119(a) to Korean patent application number 10-2021-0172362, filed on Dec. 3, 2021, which is incorporated herein by reference in its entirety.

BACKGROUND

1. Technical Field

Various embodiments of the present disclosure generally relate to a semiconductor fabrication apparatus, more particularly, to a semiconductor fabrication apparatus that may be capable of stably supplying a refrigerant.

2. Related Art

A chiller among auxiliary apparatuses for smoothly manufacturing a semiconductor may control a temperature of a refrigerant required by a chamber to supply the refrigerant to a semiconductor fabrication apparatus. One chiller may be serially connected to one chamber so that an issue with the chiller such as an inaccurate temperature control of the refrigerant, a shortage of the refrigerant, etc., may have influence on the semiconductor fabrication apparatus, thereby causing problems such as a stopping of the semiconductor fabrication, a fault of the semiconductor, etc.

SUMMARY

According to various embodiments of the present disclosure, there may be provided a semiconductor fabrication apparatus. The semiconductor fabrication apparatus may include a plurality of refrigerant suppliers, a plurality of mixers, a plurality of chambers and a common reservoir. The mixer may commonly receive a refrigerant from the refrigerant suppliers. The chambers may be connected to one of the mixers. The common reservoir may supply the refrigerant to the refrigerant suppliers. The common reservoir may collect the refrigerant from the chambers.

According to various embodiments of the present disclosure, there may be provided a semiconductor fabrication apparatus. The semiconductor fabrication apparatus may include a chamber, a plurality of mixers, a plurality of refrigerant suppliers and a common reservoir. The mixer may control supplying amounts of a high temperature refrigerant and a low temperature refrigerant in accordance with a set temperature of the chamber to provide the chamber with the high temperature refrigerant and the low temperature refrigerant. The refrigerant suppliers may be commonly connected to the mixers to continuously supply the high temperature refrigerant and the low temperature refrigerant to the mixers. The common reservoir may be commonly shared with the refrigerant suppliers to supply a refrigerant to the refrigerant suppliers. The common reservoir may collect the refrigerant from the chamber. The chamber may continuously receive a mixed refrigerant, which may be used for maintaining the set temperature, by the mixers commonly connected to the refrigerant suppliers.

BRIEF DESCRIPTION OF THE DRAWINGS

The above and other aspects, features and advantages of the subject matter of the present disclosure will be more dearly understood from the following detailed description taken in conjunction with the accompanying drawings, in which:

FIG. 2 is a view illustrating an operation for controlling charging respective amounts of a refrigerant in first and second reservoirs in accordance with various embodiments of the present disclosure;

FIG. 3 is a block diagram illustrating a heater and a cooler in accordance with various embodiments of the present disclosure;

FIG. 4 is a view illustrating a semiconductor fabrication apparatus installed by process temperatures in accordance with various embodiments of the present disclosure;

DETAILED DESCRIPTION

Various embodiments of the present invention will be described in greater detail with reference to the accompanying drawings. The drawings are schematic illustrations of various embodiments and intermediate structures. As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
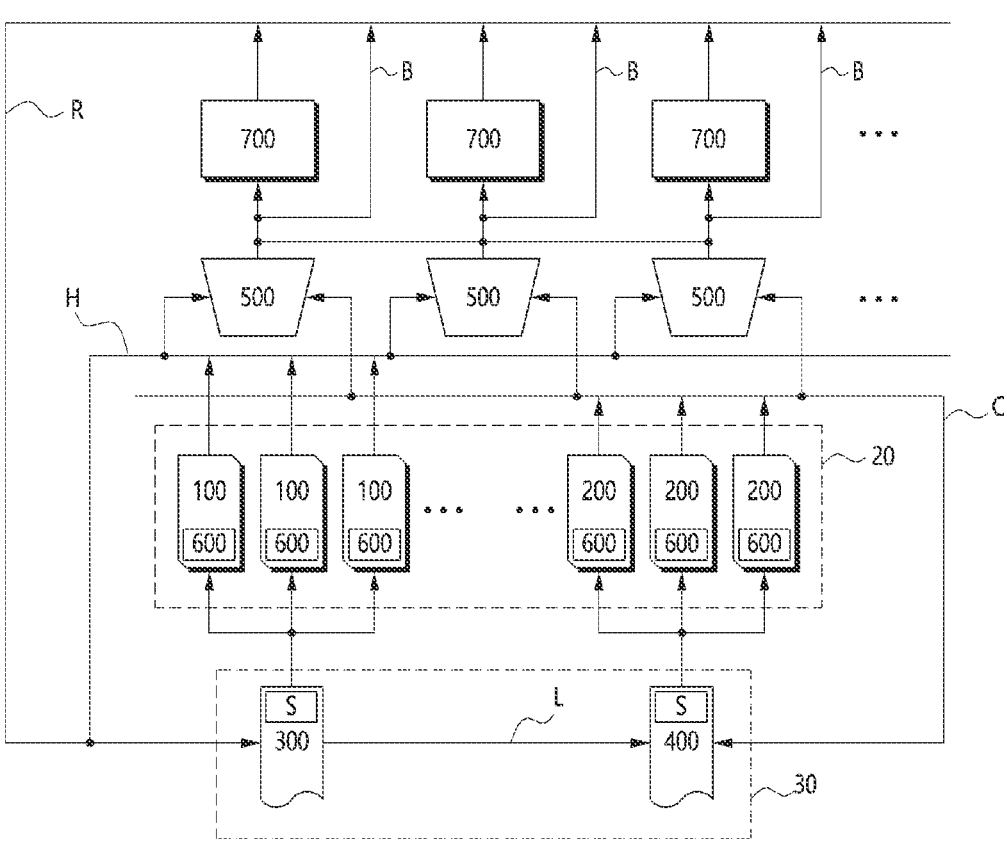
FIG. 1 is a view illustrating a semiconductor fabrication apparatus in accordance with various embodiments of the present disclosure.

FIG. 1 is a view illustrating a semiconductor fabrication apparatus in accordance with various embodiments of the present disclosure.

Referring to FIG. 1, a semiconductor fabrication apparatus 10 may include a refrigerant supplier 20, a common reservoir 30, a mixer 500, an electronic equipment unit 600 and a chamber 700. The refrigerant supplier 20 may include a plurality of heaters 100 and a plurality of coolers 200. The common reservoir 30 may include a first reservoir 300 and a second reservoir 400.

The refrigerant supplier 20 may include the heaters 100 and the coolers 200 to supply respective refrigerants to the mixer 500.

The heaters 100 may be connected in parallel to the mixer 500. The heaters 100 may be connected to the first reservoir 300 and the mixer 500 through a first manifold H. The heaters 100 may supply a heated refrigerant to the mixer 500 through the first manifold H. The heaters 100 may receive the refrigerant through the first reservoir 300 connected to the first manifold H. For example, the heaters 100 may heat the refrigerant to a temperature of about 100° C., but are not limited thereto. The refrigerant heated by the heaters 100 may be referred to as a high temperature refrigerant.

The coolers 200 may be connected in parallel to the mixer 500. The coolers 200 may be connected to the second reservoir 400 and the mixer 500 through a second manifold C. The coolers 200 may supply a cooled refrigerant to the mixer 500 through the second manifold C. The coolers 200 may receive the refrigerant through the second reservoir 400 connected to the second manifold C. For example, the coolers 200 may heat the refrigerant to a temperature of about –30° C., but are not limited thereto. The refrigerant cooled by the coolers 200 may be referred to as a low temperature refrigerant.

As mentioned above, the heaters 100 and the coolers 200 may be connected in parallel with the mixer 500. A use of the heater 100 and the cooler 200 may not be restricted only to supply the refrigerant to the chamber 700 in an etching apparatus. The heaters 100 and the coolers 200 connected in parallel with the mixer 500 may be configured to supply the refrigerant to the chamber 700 in various fabrication apparatuses. The semiconductor fabrication apparatus 10 may supply the refrigerant to a region where a temperature control may be required regardless of kinds of the fabrication apparatuses.

For example, according to related arts, when a disorder may be generated at any one of the heater 100 and the cooler 200 for supplying the refrigerant to the chamber 700 of the etching apparatus, the etching apparatus may be stopped. The disorder may then be processed. The etching apparatus may be restarted with an enable state of the refrigerant supplying.

In contrast, according to various embodiments, although the disorder may be generated at the heater 100 or the cooler 200, an adjacent another heater 100 and cooler 200 may supply the refrigerant. Thus, when the disorder may be generated in at least one of the heater 100 and the cooler 200, the remaining heater 100 and cooler 200 commonly connected with each other may supply the refrigerant to the mixer 500. As a result, a process may be performed without the stopping of the semiconductor fabrication apparatus 10. The semiconductor fabrication apparatus 10 may effectively control a temperature of the fabrication apparatus.

The common reservoir 30 may include the first reservoir 300 and the second reservoir 400. The common reservoir 30 may provide the refrigerant supplier 20 with the refrigerant. The common reservoir 30 may collect the refrigerant used in the chamber 700.

The first reservoir 300 may collect a remaining refrigerant in the heater 100, which may not be supplied to the mixer 500. The first reservoir 300 may collect the refrigerant used in the chamber 700 through a third manifold R. The first reservoir 300 may supply the refrigerant to the heaters 100 through the first manifold H. The first reservoir 300 may collect the heated refrigerant and supply the heated refrigerant to the heater 100 so that the first reservoir 300 may be referred to as a HOT reservoir.

The second reservoir 400 may collect a remaining refrigerant in the cooler 200, which may not be supplied to the mixer 500. The second reservoir 400 may receive the refrigerant from the first reservoir 300. The second reservoir 400 may supply the refrigerant to the coolers 200 through the second manifold C. The second reservoir 400 may collect the cooled refrigerant and supply the cooled refrigerant to the cooler 200 so that the second reservoir 400 may be referred to as a COLD reservoir. The second reservoir 400 may receive the refrigerant from the first reservoir 300. This may be illustrated later with reference to FIG. 2.

One mixer 500 may be connected to at least one chamber 700. The mixer 500 may be connected to the heaters 100 and the coolers 200 to receive the refrigerants respectively from the heaters 100 and the coolers 200. The mixer 500 may mix the high temperature refrigerant supplied from the heater 100 and the low temperature refrigerant supplied from the cooler 200 to control a temperature of the refrigerant required in the chamber 700. The refrigerant mixed in the mixer 500 may be referred to as a mixed refrigerant. The mixed refrigerant having a set temperature in the mixer 500 may be supplied to the chamber 700. A valve control for mixing the refrigerants with the set temperature in the mixer 500 may be illustrated later with reference to FIG. 7.

The electronic equipment unit 600 may be included in each of the heater 100 and the cooler 200 to control the operations of a corresponding module.

The first manifold H may supply the refrigerant heated by the heater 100 to the mixer 500. The first manifold H may be connected between the heater 100 and the mixer 500 and between the heater 100 and the first reservoir 300. The first manifold H may be referred to as a HOT manifold.

The second manifold C may supply the refrigerant cooled by the cooler 200 to the mixer 500. The second manifold C may be connected between the cooler 200 and the mixer 500 and between the cooler 200 and the second reservoir 400. The second manifold C may be referred to as a COLD manifold.

A pressure sensor configured to detect a pressure in the first and second manifolds H and C may be attached to the first and second manifolds H and C. When the chamber 700 may be suddenly stopped, the supplying of the refrigerant to the chamber 700 may be blocked to increase the pressure in the manifold. The pressure sensor may detect the pressure in the manifold. The pressure in the manifold may then be transmitted to a controller 900 (see FIG. 6). The controller 900 may control a valve in the semiconductor fabrication apparatus 10 to distribute the refrigerants into the reservoirs of each manifold, thereby maintaining the pressure in the manifold.

The third manifold R may supply the refrigerant used in the chamber 700 to the first reservoir 300. The refrigerant heat-exchanged in the chamber 700 may have a high temperature. Heating the high temperature refrigerant rather than cooling the high temperature refrigerant may be effective in view of a necessary time and energy. Thus, the refrigerant used in the chamber 700 may be collected in the first reservoir 300 configured to supply the refrigerant to the heater 100. Therefore, the third manifold R may be connected between the chamber 700 and the first reservoir 300.

A bypass duct B may be connected between the mixer 500 and the third manifold R, not in way of the chamber 700. For example, when the supplying of the refrigerant may not be required due to a chamber repair, the refrigerant in the mixer

500 may be collected in the first reservoir 300, not the chamber 700, through the bypass duct B. The refrigerant in the mixer 500 may be directly collected in the first reservoir 300 through the bypass duct B in various conditions as well as for the chamber repair. The refrigerant in the mixer 500 may be collected in the first reservoir 300 through the bypass duct B and the third manifold R. Alternatively, the refrigerant, which may not be supplied to the chamber 700 for controlling an amount of the refrigerant supplied from the mixer 500 to the chamber 700, may be collected in the first reservoir 300 through the bypass duct B and the third manifold R.

A connection duct L may be connected between the first reservoir 300 and the second reservoir 400. Because the refrigerant used in the chamber 700 may be collected in the first reservoir 300, an amount of the refrigerant in the first reservoir 300 may be different from an amount of the refrigerant in the second reservoir 400. In order to balance the amounts of the refrigerant in the first and second reservoirs, the refrigerant in the first reservoir 300 may be transferred to the second reservoir 400 through the connection duct L.

FIG. 2 is a view illustrating an operation for controlling charging respective amounts of a refrigerant in first and second reservoirs in accordance with various embodiments of the present disclosure Referring to FIG. 2, the first reservoir 300 may be connected with the second reservoir 400 through the connection duct L. As mentioned above, the refrigerant having the high temperature used in the chamber 700 may be collected in the first reservoir 300 for supplying the refrigerant to the heater 100. The refrigerant used in the chamber 700 may be collected in only the first reservoir 300, not the second reservoir 400. Because the used refrigerant may be collected in only the first reservoir 300, the amount of the refrigerant in the first reservoir 300 may be different from the amount of the refrigerant in the second reservoir 400. A sensor S may be provided to the first reservoir 300 and the second reservoir 400. The sensor S in the first and second reservoirs 300 and 400 may detect the respective amounts of the refrigerant in the first and second reservoirs 300 and 400. The united information storage 800 may be connected with the controller 900. The united information storage 800 may transfer the refrigerant in the first reservoir 300 to the second reservoir 400 to provide the first and second reservoirs 300 and 400 with a balance between the respective amounts of the refrigerant.

Figure 3:
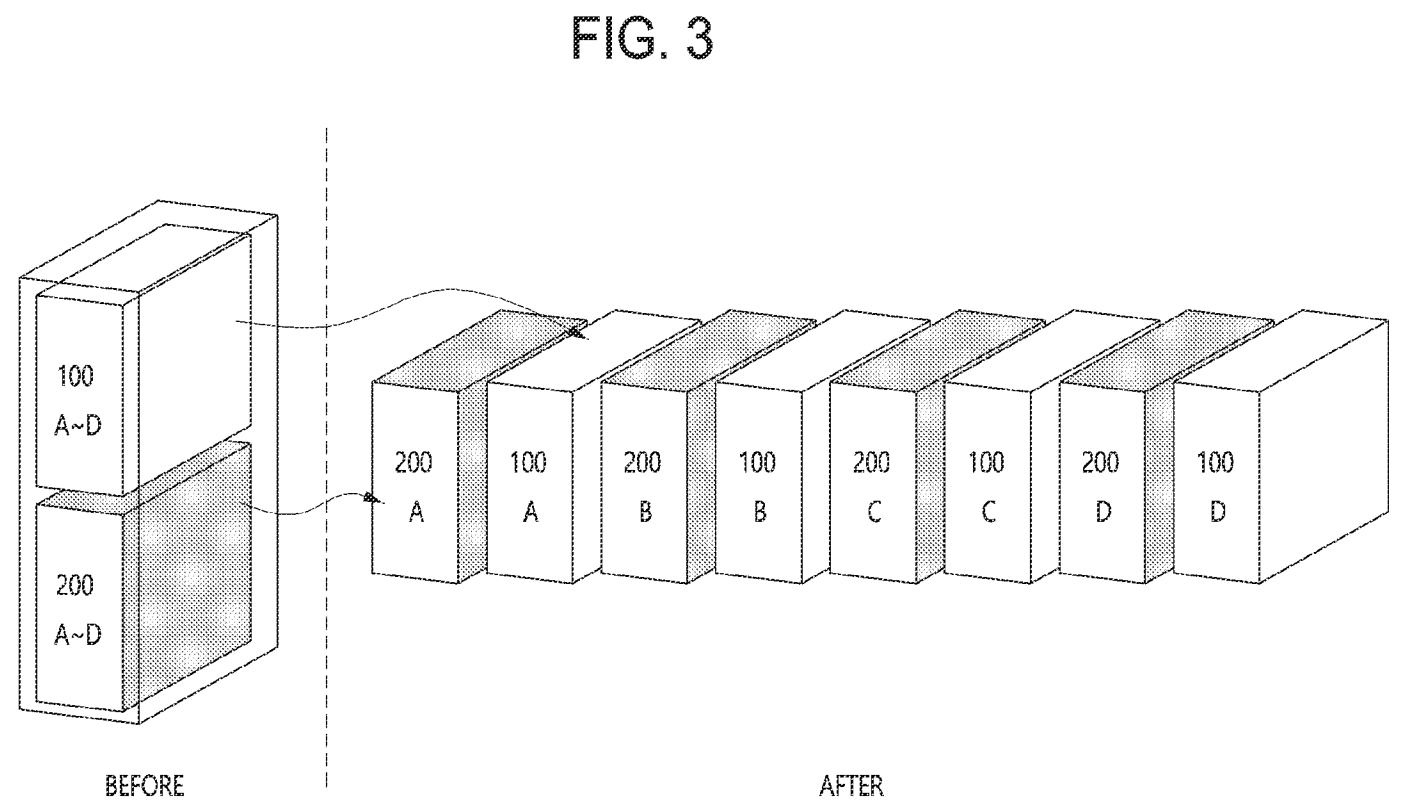
Figure 4:
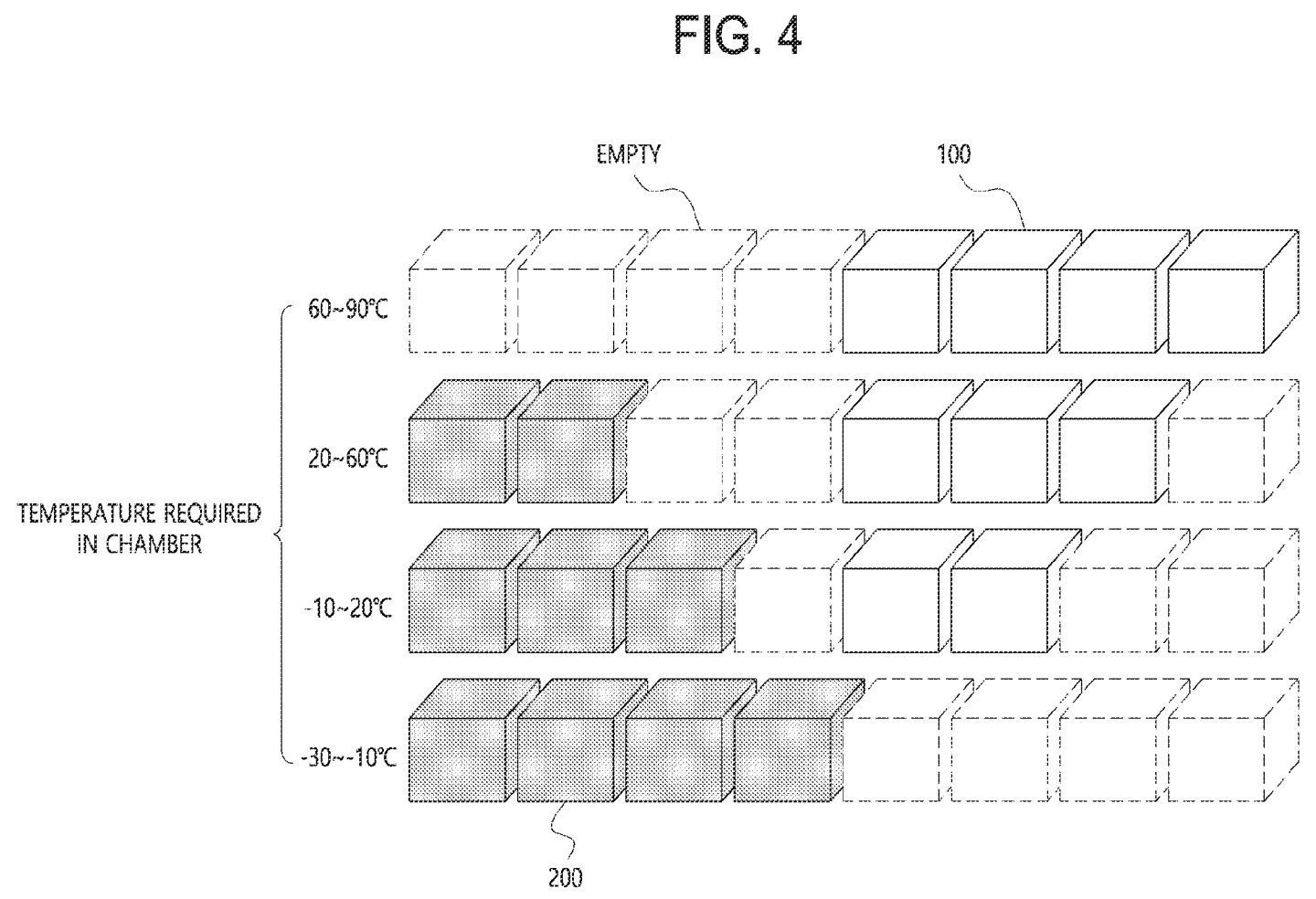
Figure 5:
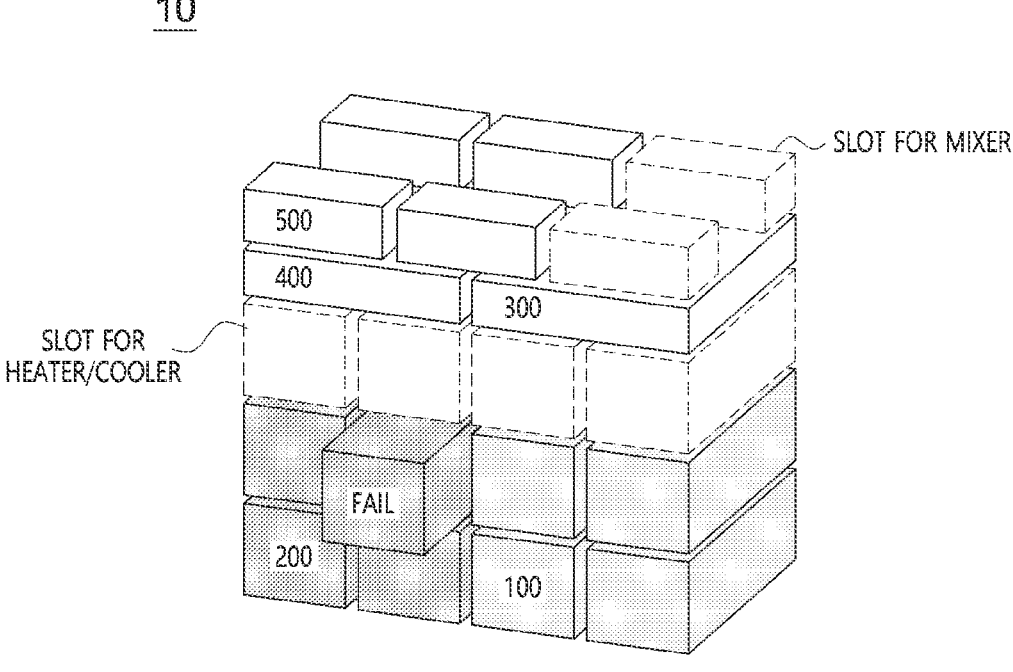
FIG. 5 is a block diagram illustrating elements of a semiconductor fabrication apparatus in accordance with various embodiments of the present disclosure.

FIG. 3 is a block diagram illustrating a heater and a cooler in accordance with various embodiments of the present disclosure, FIG. 4 is a view illustrating a semiconductor fabrication apparatus installed by process temperatures in accordance with various embodiments of the present disclosure and FIG. 5 is a block diagram illustrating elements of a semiconductor fabrication apparatus in accordance with various embodiments of the present disclosure.

Referring to FIG. 3, the elements in the semiconductor fabrication apparatus 10 may be depicted as blocks. Particularly, the heater 100 and the cooler 200 may be represented by relatively large blocks. Although other elements of the semiconductor fabrication apparatus 10 may not be depicted in FIG. 3, the semiconductor fabrication apparatus 10 may also include the above-mentioned elements.

In a conventional chiller system, the heater and the cooler may be included in one set. Thus, a space where the chiller system used for the chamber may be required. In contrast, according to various embodiments, the heater 100 and the cooler 200 may be individually installed in the semiconductor fabrication apparatus 10. Because the chambers 700 may require different temperatures of the refrigerant in accordance with processes, numbers of the heaters 100 and the coolers 200 in the semiconductor fabrication apparatus 10 may be controlled.

Referring to FIG. 4, a temperature range of the refrigerant required in the chamber 700 may be represented. The numbers of the heaters 100 and the coolers 200 may be changed in regions of the corresponding chamber 700. Although not depicted in FIGS. 3 and 4, other elements of the semiconductor fabrication apparatus 10 such as the first reservoir 300, the second reservoir 400, the mixer 500, etc., may be necessarily installed.

Because the numbers of the heater 100 and the cooler 200 may be controlled, the refrigerant may be readily supplied in accordance with process temperatures. The process temperatures may be required in accordance with the fabrication apparatuses. For example, the numbers of the cooler 200 may be increased in proportion to a low process temperature. In contrast, the numbers of the heaters 100 may be increased in proportion to a high process temperature. Alternatively, the semiconductor fabrication apparatus 10 may include various combinations of the heaters 100 and the coolers 200, but are not limited to the combination in FIG. 4.

Referring to FIG. 5, the heater 100, the cooler 200, the first reservoir 300, the second reservoir 400 and the mixer 500 may be represented by stacked blocks. The semiconductor fabrication apparatus 10 may include an empty slot. Other elements such as the heater 100, the cooler 200, etc., may be installed in the empty slot. When a disorder may be generated at the other elements such as the heater 100, the cooler 200, etc., an exchange or a repair may be required, only a corresponding element may be released so that the corresponding element may be repaired. Because the heaters 100 and the coolers 200 may be connected in parallel with each other, the disordered element may be exchanged and repaired without the supplying of the refrigerant. That is, because only the disordered cooler 200 may be repaired and other elements such as the adjacent heater 100 or the cooler 200 may be normally operated, so that the refrigerant may be continuously supplied to the mixer 500.

Figure 6:
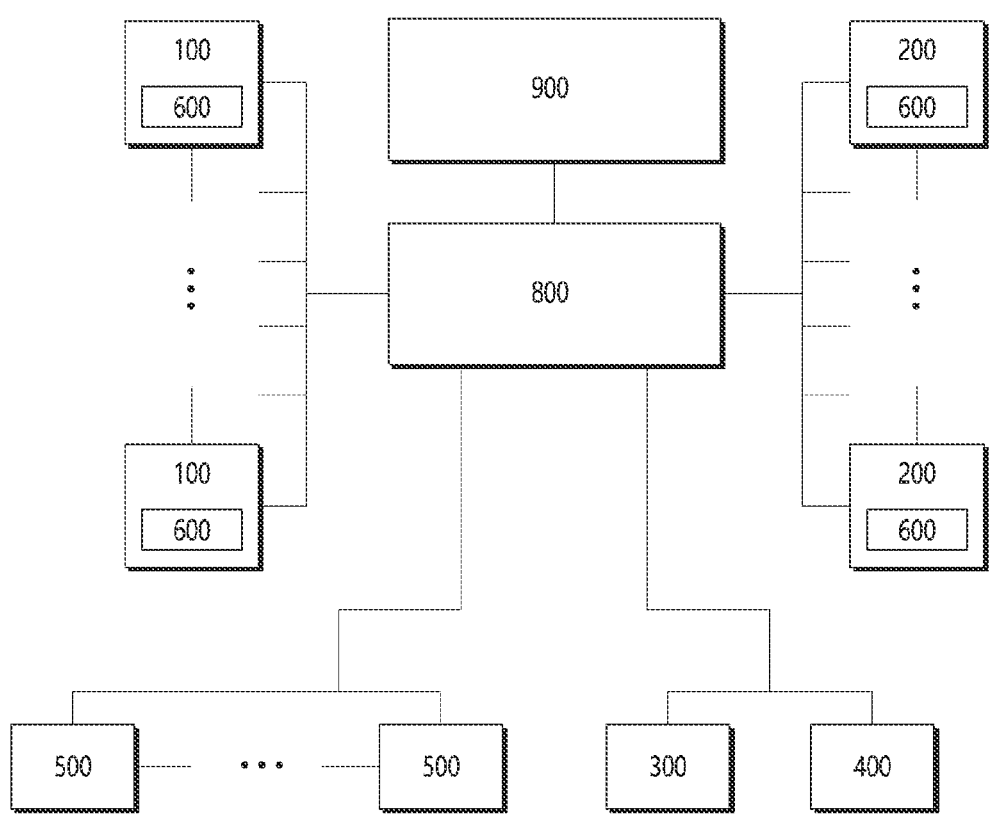
FIG. 6 is a view illustrating a united information storage in accordance with various embodiments of the present disclosure.

FIG. 6 is a view illustrating a united information storage in accordance with various embodiments of the present disclosure.

Referring to FIG. 6, the information in the elements of the semiconductor fabrication apparatus 10 may be collected in the united information storage 800. The united information storage 800 may store the information of the heater 100, the cooler 200, the first reservoir 300, the second reservoir 400 and the mixer 500. The united information storage 800 may be connected with the controller 900. The controller 900 may transmit control commands to the elements based on the information received from the united information storage 800. The united information storage 800 may provide a display of each of the elements with the information. A user may remotely recognize the information. The user may remotely control the semiconductor fabrication apparatus 10 based on the information in the united information storage 800.

The information in the united information storage 800 may include the set temperature of the refrigerant heated by the heater 100, a temperature and a flux of the refrigerant in the heater 100. The information in the united information storage 800 may include the set temperature of the refrigerant cooled by the cooler 200, a temperature and a flux of the refrigerant in the cooler 200. The information in the united information storage 800 may include the amounts of the refrigerant in the first and second reservoirs 300 and 400. The information in the united information storage 800 may include the set temperature of the refrigerant supplied to the chamber 700, the temperature and the flux of the refrigerant in the mixer 500 and the chamber 700 to which the refrigerant may be supplied. The information in the united information storage 800 may include other information, but is not limited thereto. The united information storage 800 may store all information related to the semiconductor fabrication apparatus 10. The united information storage 800 may share the information with the controller 900.

Further, the united information storage 800 may issue an alarm for information of a disordered element. The user may remotely recognize the alarm by controlling the controller 900 or directly recognize the alarm in the semiconductor fabrication apparatus 10.

Figure 7:
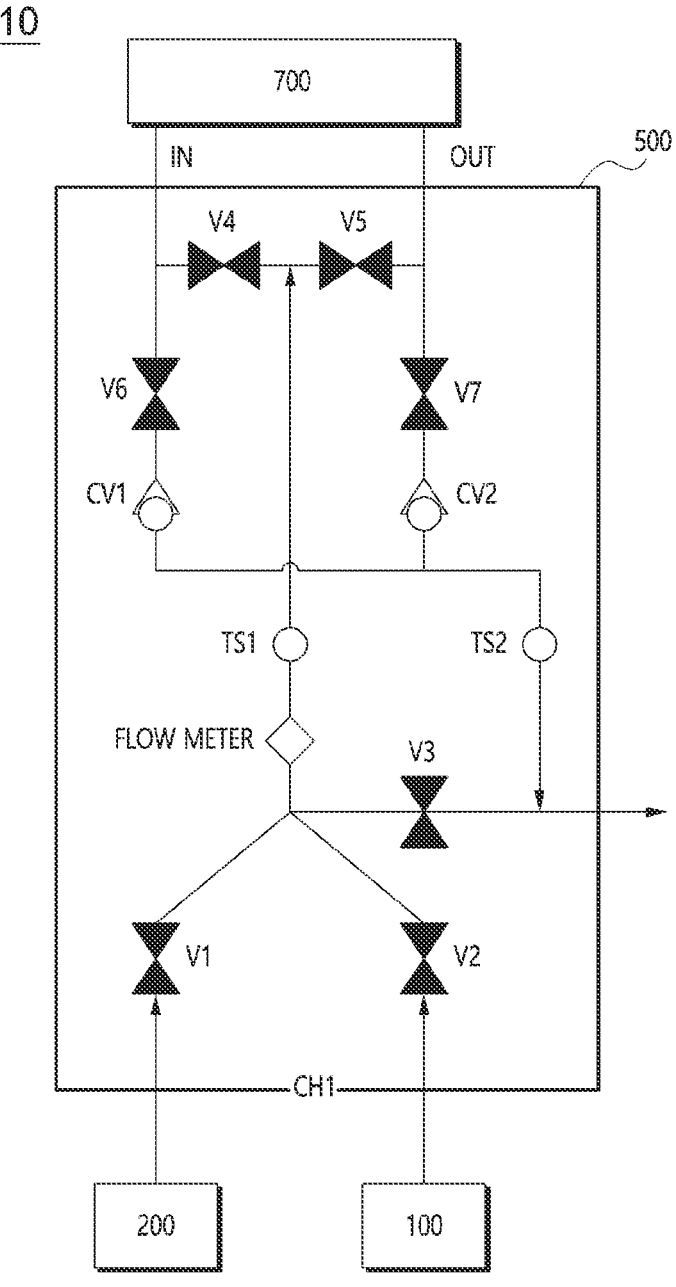
FIG. 7 is a view illustrating a mixer of a semiconductor fabricating apparatus in accordance with various embodiments of the present disclosure.
Figure 8:
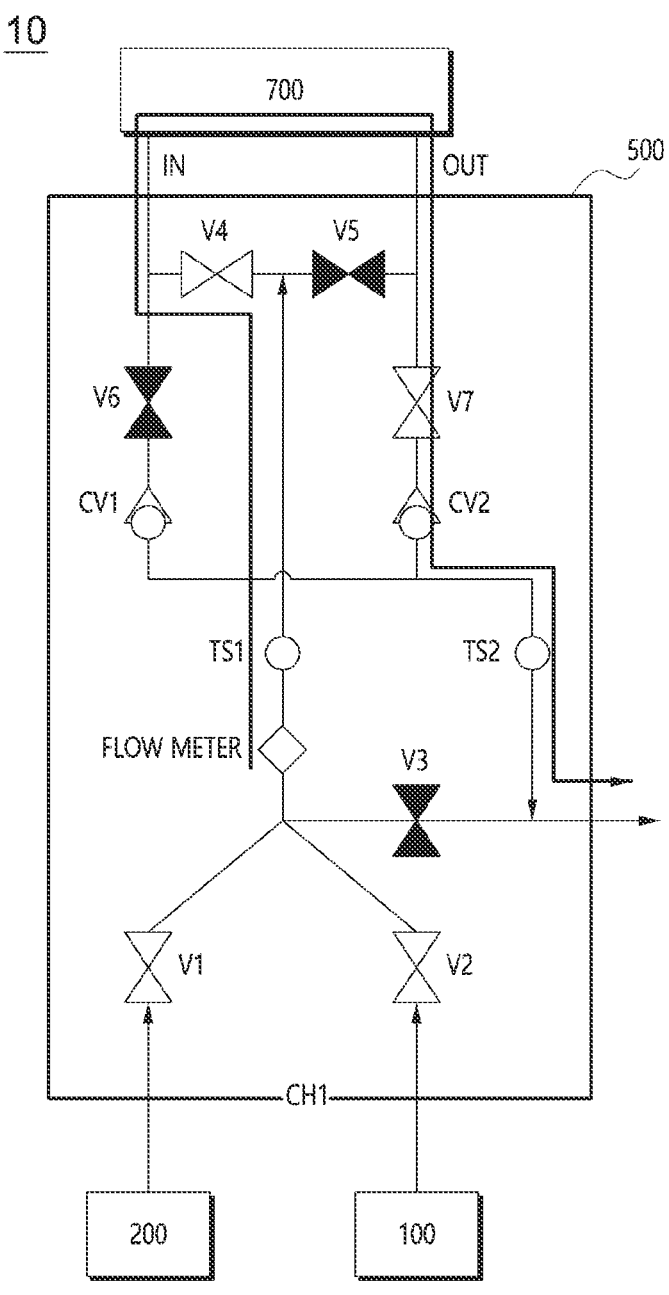
FIG. 8 is a view illustrating a flow of refrigerants in a forward direction of a mixer in accordance with various embodiments of the present disclosure.
Figure 9:
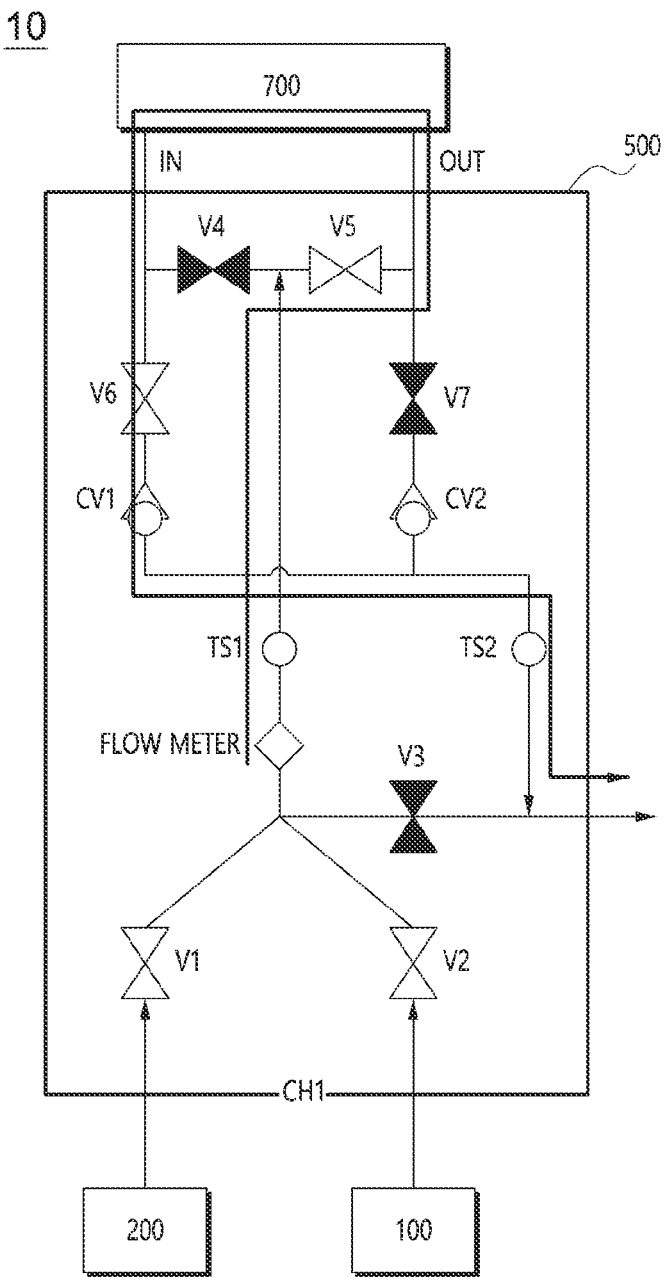
FIG. 9 is a view illustrating a flow of refrigerants in a reverse direction of a mixer in accordance with various embodiments of the present disclosure.

FIG. 7 is a perspective view illustrating a duct and a valve in a mixer in accordance with various embodiments of the present disclosure, FIG. 8 is a view illustrating a flow of refrigerants in a forward direction of a mixer in accordance with various embodiments of the present disclosure and FIG. 9 is a view illustrating a flow of refrigerants in a reverse direction of a mixer in accordance with various embodiments of the present disclosure.

Referring to FIG. 7, the semiconductor fabrication apparatus 10 may include a first valve V1 and a second valve V2. The first valve V1 may be installed between the cooler 200 and the mixer 500. The second valve V2 may be arranged between the mixer 500 and the heater 100.

The mixer 500 may be connected with the chamber 700 through a passage. Further, the mixer 500 may be connected to the first reservoir 300 through a passage. The refrigerant may be collected in the first reservoir 300 from the mixer 500 through the bypass duct B and the third manifold R. A third valve V3 may be arranged between the mixer 500 and the bypass duct B to control the flow of the refrigerant. A flow meter may detect a flux of the refrigerant supplied to the chamber 700 from the mixer 500. The flow meter may detect the flux of the refrigerant and the third valve V3 may control the flux of the refrigerant supplied from the mixer 500 to the chamber 700 to supply the refrigerant to the bypass duct B from the mixer 500. When the refrigerant in the mixer 500, not supplied to the chamber 700 may be collected in the first reservoir 300, the refrigerant may be supplied to the bypass duct B by controlling the third valve V3 to collect the refrigerant in the first reservoir 300 through the third manifold R.

The flow meter may be arranged between the mixer 500 and the chamber 700. The duct passing through the flow meter may be branched into two ducts. An inlet and an outlet may be installed at the two branched ducts through which the refrigerant may be introduced into the chamber 700. A fourth valve V4 may be installed at the inlet and a fifth valve V5 may be installed at the outlet. In order to collect the refrigerant used in the chamber 700 in the first reservoir 300, the ducts extended from the inlet and the outlet of the chamber 700 may be connected with each other. The connected duct may be connected to the first reservoir 300. A sixth valve V6 and a seventh valve V7 may be installed at the ducts. First and second check valves CV1 and CV2 may be configured to prevent a counter flow of the refrigerant when the refrigerant may be collected in the first reservoir 300.

Additionally, temperature sensors TS1 and TS2 may be installed at the ducts connected between the mixer 500 and the chamber 700. The positions of the temperature sensors TS1 and TS2 may not be restricted within the illustrations of FIG. 7.

The mixer 500 may mix the refrigerants, which may be supplied to the chamber 700, to provide the refrigerant with the set temperature. The refrigerant mixed by the mixer 500 may be referred to as the mixed refrigerant. The temperature sensor in the mixer 500 may detect the temperature of the refrigerant. The detected temperature of the refrigerant may then be transmitted to the united information storage 800 or the controller 900. The controller 900 may calculate a difference between the detected temperature of the refrigerant and the set temperature. The controller 900 may control the refrigerants supplied from the heater 100 and the cooler 200 using the first and second valves V1 and V2.

For example, the heater 100 may supply the refrigerant having a temperature of about 100° C. to the mixer 500. The cooler 200 may supply the refrigerant having a temperature of about −30° C. to the mixer 500. When the set temperature of the refrigerant to be supplied to the chamber 700 may be about −30° C., the second valve V2 connected to the heater 100 may be closed and the first valve V1 connected to the cooler 200 may be opened to provide the refrigerant with the set temperature. When the set temperature of the refrigerant to be supplied to the chamber 700 may be about 100° C., to the second valve V2 connected to the heater 100 may be opened and the first valve V1 connected to the cooler 200 may be closed to provide the refrigerant with the set temperature. When the set temperature of the refrigerant to be supplied to the chamber 700 may be a value between about 100° C. and about −30° C., opening ratios of the first and second valves V1 and V2 may be controlled to provide the refrigerant with the set temperature.

Referring to FIGS. 8 and 9, the forward flow and the counter flow of the refrigerants may be shown.

In various embodiments, the inlet and the outlet through which the refrigerant may be introduced into the chamber 700 may be changed. According to related arts, in order to change the inlet and the outlet through which the refrigerant may be introduced into the chamber 700, the chiller may be stopped. Ducts of the inlet and the outlet may be exchanged with each other. The exchanged ducts may be installed to change the inlet and the outlet. After the refrigerant may be supplied, the chiller may then be stopped. The ducts of the inlet and the outlet may be exchanged to the original position.

According to various embodiments, the directions of the inlet and the outlet through which the refrigerant may be introduced into the chamber 700 may be controlled to the forward flow or the counter flow by the valve control.

In FIG. 8, the refrigerant may have the forward flow from the inlet to the outlet in the chamber 700. In order to provide the refrigerant with the forward flow, the controller 900 may open the fourth valve V4 at the inlet of the chamber 700 and the seventh valve V7 at the outlet of the chamber 700 and close the fifth valve V5 and the sixth valve V6.

In contrast, in FIG. 9, the refrigerant may have the counter flow from the outlet to the inlet in the chamber 700. In order to provide the refrigerant with the counter flow, the controller 900 may open the fifth valve V5 at the outlet of the chamber 700 and the sixth valve V6 at the inlet of the chamber 700 and close the fourth valve V4 and the seventh valve V7.

In FIG. 8 and FIG. 9, the valves marked with a solid shape may indicate a close state and the valves marked with a hollow shape may indicate an open state.

Figure 10:
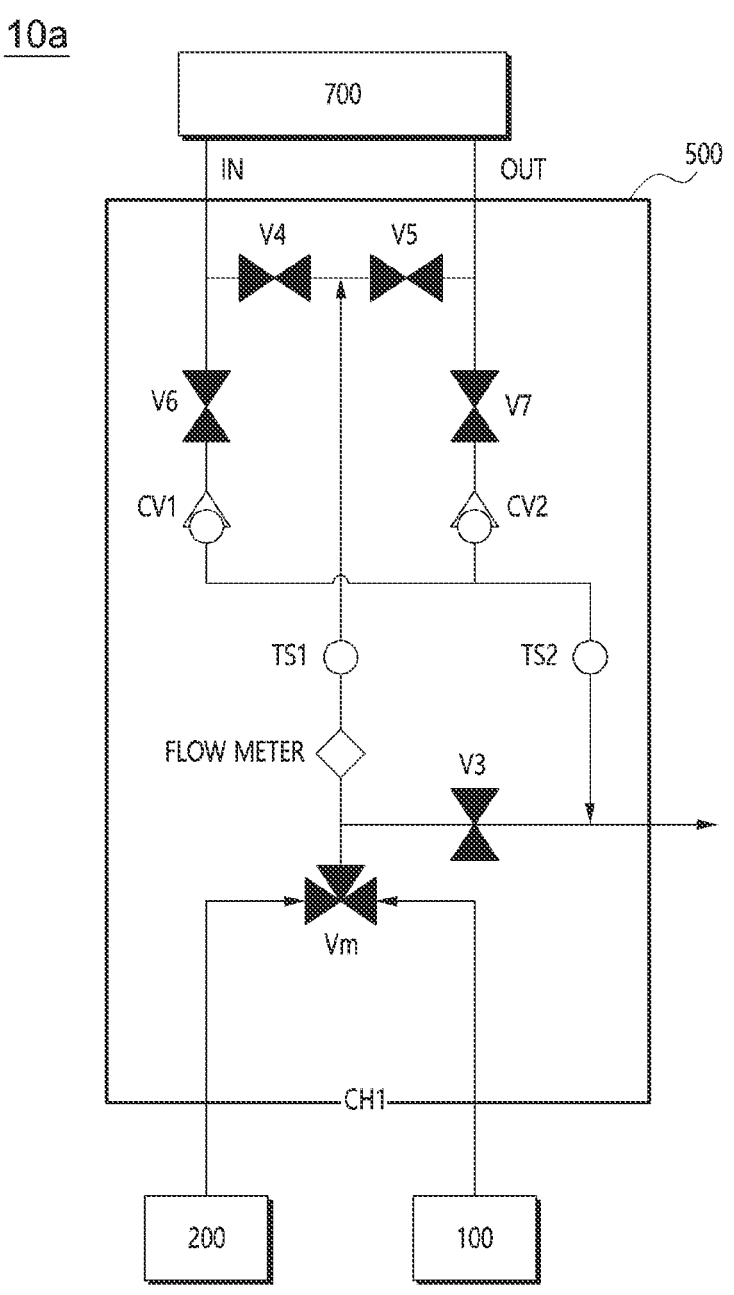
FIG. 10 is a view illustrating a mixer of a semiconductor fabricating apparatus in accordance with various embodiments of the present disclosure.

FIG. 10 is a view illustrating a mixer of a semiconductor fabricating apparatus in accordance with various embodiments of the present disclosure.

Referring to FIG. 10, a semiconductor fabrication apparatus 10a may include a structure similar to that of the semiconductor fabrication apparatus 10 except for the first valve V1 and the second valve V2 of the semiconductor fabrication apparatus 10. The semiconductor fabrication apparatus 10a may include a multi-way valve Vm. The multi-way valve Vm may be coupled among the heater 100, the cooler 200 and the flow meter. For example, the multi-way valve may be a three-way type valve. The refrigerant may be mixed by the multi-way valve Vm and a temperature of the refrigerant may be controlled.

Therefore, the semiconductor fabrication apparatus 10 may provide the refrigerant flowing into the chamber 700 with the forward direction or the counter direction.

According to various embodiments, the semiconductor fabrication apparatus 10 may continuously supply the refrigerant to the chamber without an interruption. The heaters 100, the coolers 200 and the mixers 500 may be connected in parallel with each other. When one of the elements in the semiconductor fabrication apparatus 10 may be exchanged or repaired, the exchange or the repair may be performed on only a disordered element without the stopping of the refrigerant supply. During the exchange or the repair, the heaters 100 and the coolers 200 connected in parallel with each other may supply the refrigerants. Thus, the semiconductor fabrication process may be continuously performed to increase productivity.

Further, the numbers of the heaters 100 and the coolers 200 may be necessarily controlled. The element may be readily installed or removed.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications would be apparent in view of the present disclosure and are intended to fall within the scope of the appended claims. Furthermore, the embodiments may be combined to form additional embodiments.

What is claimed is:

1. A semiconductor fabrication apparatus comprising:
a common reservoir configured to include a first reservoir for reserving a first refrigerant and a second reservoir for reserving a second refrigerant;
a refrigerant supplier configured to include a plurality of heaters for heating the first refrigerant supplied from the first reservoir and a plurality of coolers for cooling the second refrigerant supplied from the second reservoir; and
a plurality of mixers each connected to a plurality of chambers in common and configured to mix a high temperature refrigerant supplied from one of the plurality of heaters and a low temperature refrigerant supplied from one of the plurality of coolers, and to supply a mixed refrigerant to one of the plurality of chambers,
wherein the plurality of heaters are each connected in parallel to the plurality of mixers, and
wherein the plurality of coolers are each connected in parallel to the plurality of mixers.

2. The semiconductor fabrication apparatus of claim 1, wherein the first reservoir, the second reservoir, the plurality of heaters, the plurality of coolers and the plurality of mixers are each detachably installed in a plurality of slots.

3. The semiconductor fabrication apparatus of claim 1, wherein each of the plurality of mixers is further configured to control a flux of a heated first refrigerant supplied from one of the plurality of heaters and a flux of a cooled second refrigerant supplied from one of the plurality of coolers in accordance with a set temperature of the one of the plurality of chambers.

4. The semiconductor fabrication apparatus of claim 1, wherein
a number of the plurality of heaters and a number of the plurality of coolers are adjusted in accordance with a temperature range of a refrigerant required for each of the plurality of chambers, respectively.

5. The semiconductor fabrication apparatus of claim 1, wherein the mixed refrigerant used in the plurality of chambers is collected in the first reservoir of the common reservoir.

6. The semiconductor fabrication apparatus of claim 5,
wherein the first reservoir is connected with the second reservoir,
wherein the first reservoir provides a collected mixed refrigerant to the second reservoir to balance amounts of the first and second refrigerants in the first and second reservoirs, and
wherein the first reservoir and the second reservoir supply the first and second refrigerant to the heaters and the coolers, respectively, under a condition that an amount of the first refrigerant in the first reservoir and an amount of the second refrigerant in the second reservoir are balanced.

7. The semiconductor fabrication apparatus of claim 1, further comprising a bypass duct directly connected between the plurality of mixers and the first reservoir.

8. The semiconductor fabrication apparatus of claim 1, further comprising a united information storage configured to store information of the refrigerant supplier, the plurality of mixers and the common reservoir.

9. The semiconductor fabrication apparatus of claim 8, further comprising a controller connected with the united information storage and configured to control the refrigerant supplier, the plurality of mixers and the common reservoir.

10. The semiconductor fabrication apparatus of claim 9, wherein the controller is further configured to control a valve between a selected one of the plurality of mixers and a selected one of the plurality of chambers to control a flow direction of the refrigerants between the selected mixer and the selected chamber.

11. A semiconductor fabrication apparatus comprising:
a plurality of chambers;
a plurality of mixers each connected in parallel to the plurality of chambers and each configured to mix a high temperature refrigerant and a low temperature refrigerant in accordance with a set temperature of one of the plurality of chambers, and supply a mixed refrigerant to the one of the plurality of chambers;
a plurality of heaters each connected in parallel to the plurality of mixers, and each configured to heat a refrigerant supplied from a first reservoir, and supply the high temperature refrigerant to one of the plurality of mixers; and
a plurality of coolers each connected in parallel to the plurality of mixers, each configured to cool a refrigerant supplied from a second reservoir, and supply the low temperature refrigerant to one of the plurality of mixers, wherein the mixed refrigerant used in the plurality of chambers is collected in the first reservoir.

12. The semiconductor fabrication apparatus of claim 11, wherein a number of the plurality of heaters and a number of the plurality of coolers are adjusted in accordance with a temperature range of a refrigerant required for each of the plurality of chambers, respectively.

13. The semiconductor fabrication apparatus of claim 11, wherein the first reservoir, the second reservoir, the plurality of heaters, the plurality of coolers and the plurality of mixers are each detachably installed in a plurality of slots.

14. The semiconductor fabrication apparatus of claim 11, wherein each of the plurality of mixers controls a flux of the high temperature refrigerant supplied from one of the plurality of heaters and a flux of the low temperature refrigerant supplied from one of the plurality of coolers in accordance with a set temperature of the one of the plurality of chambers.

15. The semiconductor fabrication apparatus of claim 11, wherein the first reservoir is connected with the second reservoir, wherein the first reservoir provides a collected mixed refrigerant to the second reservoir to balance amounts of the refrigerants in the first and second reservoirs, and wherein the first reservoir and the second reservoir supply refrigerants to the heaters and the coolers, respectively, under a condition that an amount of the refrigerant in the first reservoir and an amount of the refrigerant in the second reservoir are balanced.

16. The semiconductor fabrication apparatus of claim 11, further comprising a bypass duct directly connected between the plurality of mixers and the first reservoir.

17. An apparatus comprising:

a plurality of heaters each coupled to a first transmission line in common and configured to supply a high temperature refrigerant to the first transmission line;

a plurality of coolers each coupled to a second transmission line in common and configured to supply a low temperature refrigerant to the second transmission line;

a plurality of mixers each coupled to each of the first transmission line, the second transmission line and a third transmission line in common and configured to mix the high temperature refrigerant and the low temperature refrigerant supplied through the first and second transmission lines to provide a mixed refrigerant to one of a plurality of chambers through the third transmission line; and a common reservoir configured to include a first reservoir for supplying a refrigerant to the plurality of heaters and reserving therein a refrigerant discharged from the plurality of chambers, and a second reservoir for supplying a refrigerant to the plurality of coolers.

* * * * *